(12) United States Patent
Fukui et al.

(10) Patent No.: US 6,417,442 B1
(45) Date of Patent: Jul. 9, 2002

(54) SOLAR BATTERY ASSEMBLY AND METHOD OF FORMING A SOLAR BATTERY ASSEMBLY

(75) Inventors: Atsushi Fukui; Keisuke Kimoto; Migaku Ishida, all of Fukuoka (JP)

(73) Assignee: Mitsui High-tec, Inc., Kitakyushu (JP)

( * ) Notice: Subject to any disclaimer, the term of this patent is extended or adjusted under 35 U.S.C. 154(b) by 0 days.

(21) Appl. No.: 09/740,229

(22) Filed: Dec. 18, 2000

(51) Int. Cl.[7] ............... H01L 31/05; H01L 31/0352; H01L 31/18
(52) U.S. Cl. ............. 136/250; 136/244; 438/63; 438/73; 438/98; 148/DIG. 120
(58) Field of Search ............... 136/250, 244; 438/63, 73, 98; 148/DIG. 120

(56) References Cited

U.S. PATENT DOCUMENTS 2,904,613 A * 9/1959 Paradise .................. 136/250
5,091,319 A * 2/1992 Hotchkiss et al. ........... 136/250
6,204,545 B1 * 3/2001 Nakata ..................... 257/459
6,294,822 B1 * 9/2001 Nakata ..................... 257/461

FOREIGN PATENT DOCUMENTS

JP 2000-216335 A * 8/2000
JP 2001-177121 A * 6/2001

* cited by examiner

Primary Examiner—Alan Diamond
(74) Attorney, Agent, or Firm—Wood, Phillips, Katz, Clark & Mortimer

(57) ABSTRACT

A method of forming a solar battery assembly. The method includes the steps of: providing a plurality of spherically-shaped cells, each having a semiconductor layer and an outer electrode layer; forming a solder layer between the plurality of spherically-shaped cells so as to maintain the plurality of spherically-shaped cells in a desired relationship; removing a part of the outer electrode layer to expose a part of the semiconductor layer; and placing an inner electrode in contact with the exposed part of the semiconductor layer.

36 Claims, 5 Drawing Sheets

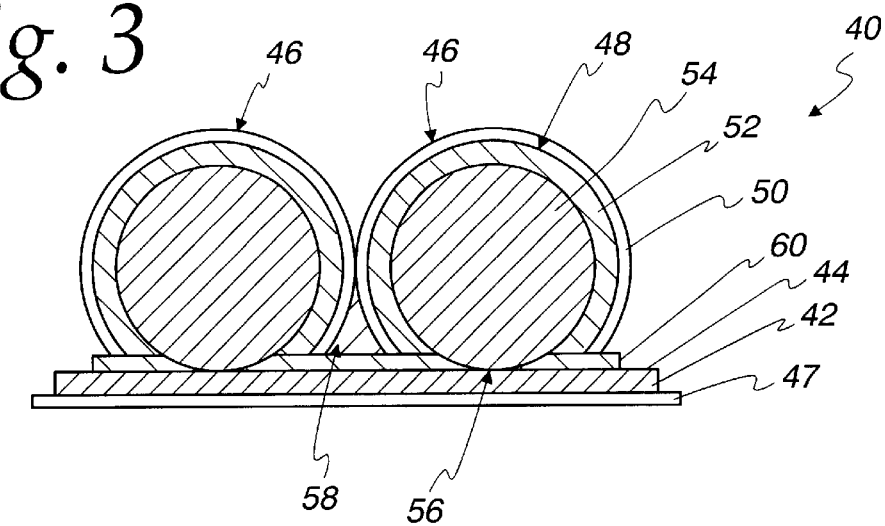
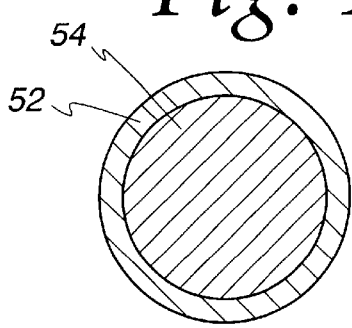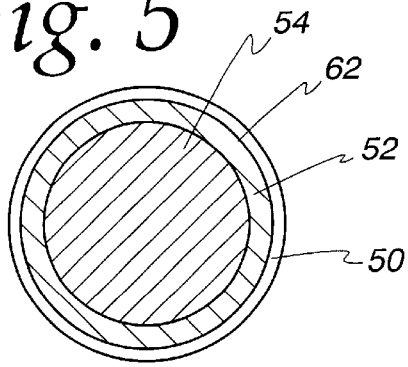
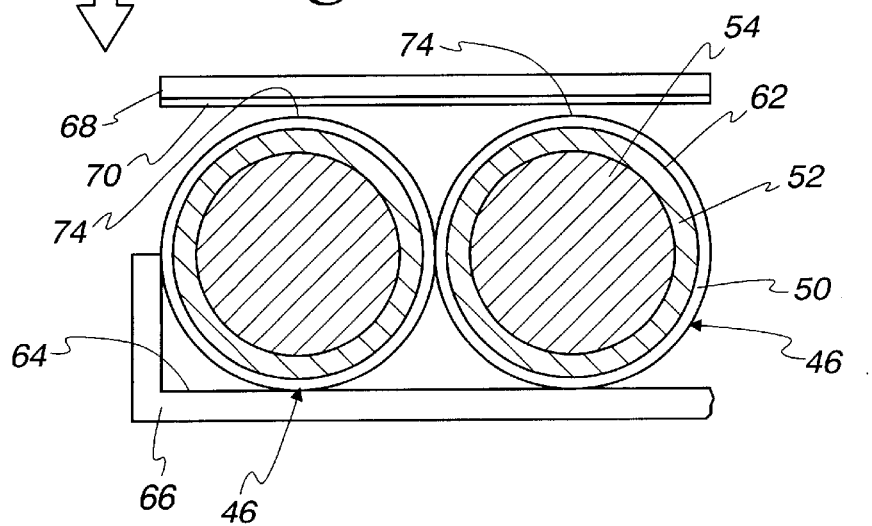

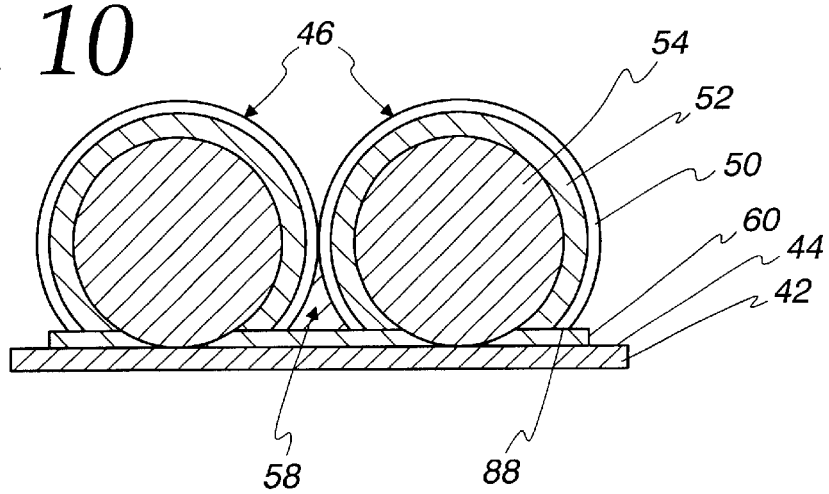
*Fig.* 10
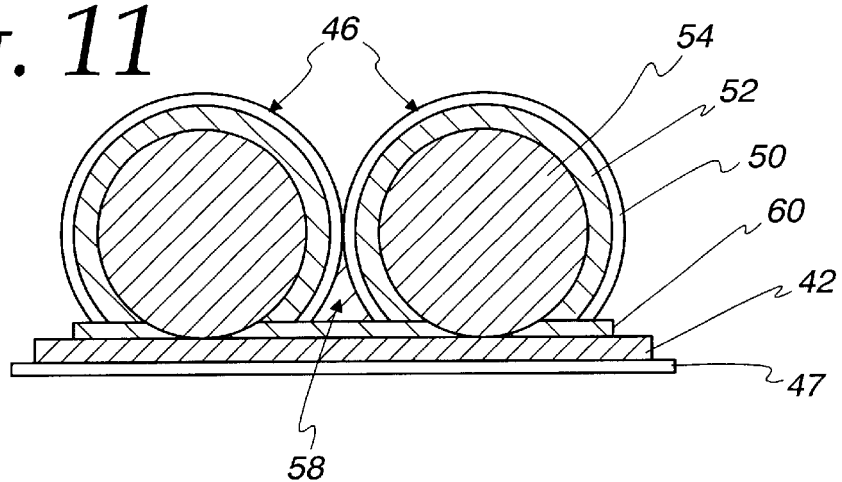
*Fig.* 11
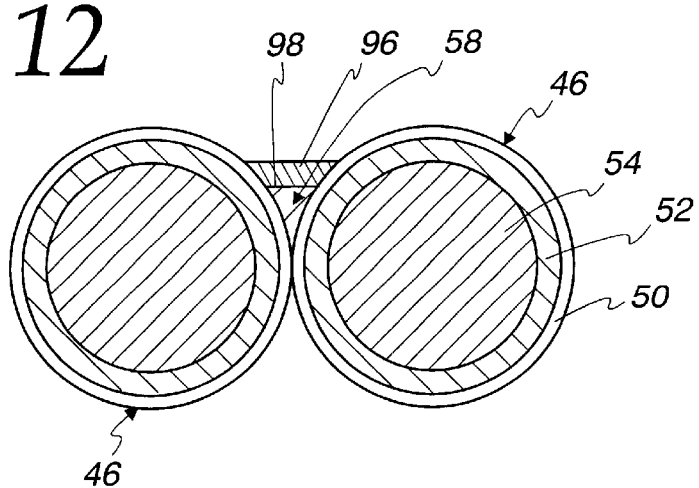
*Fig.* 12

SOLAR BATTERY ASSEMBLY AND METHOD OF FORMING A SOLAR BATTERY ASSEMBLY

BACKGROUND OF THE INVENTION

1. Field of the Invention

This invention relates to solar batteries of the type having spherically-shaped cells. The invention is also directed to a method of forming a solar battery assembly.

2. Background Art

In a conventional solar battery, an internal electrical field is generated between P–N connecting members of a semiconductor layer. Impingement of light upon the solar battery develops electron/electron hole pairs. The electrons collect on the N side, with the electron holes formed on the P side. With an external load connected, electric current flows from the P side toward the N side. Through this process, solar batteries are able to convert light energy into useable electrical energy. In recent years, solar batteries have been made using spherical semiconductors. The spherical semiconductors may be monocrystal or polycrystal silicon, typically with a diameter of less than 1 mm.

An example of a conventional solar battery using spherical semiconductors is described in Kokai 6-13633 and shown in FIG. 1, herein, at 10. The solar battery 10 consists of an array of spherical semiconductors 12 which are connected together utilizing a conductive board 14, which in this case is shown to be aluminum foil, or the like. Each of the spherical semiconductors 12 has a primary conductive skin 16 which envelops a secondary conductive core 18. The spherical semiconductors 12 are placed in an opening 20 in the conductive board 14 so as to project from opposite sides 22 and 24 of the board 14. A portion of the skin 16 is removed from the spherical semiconductor 12 on the side 24 of the board 14. An insulating layer 26 is formed against the core 18 which is exposed where the external skin 16 is removed. A portion of the core 18 and insulating layer 26 is removed at 28 so as to form a flat surface 30 which can be connected to a secondary conductive member 32, which in this case is aluminum foil. The surface 30 is connected in a high quality, ohmic manner to the conductive member 32.

It is difficult to maintain a precise relationship between the semiconductors 12 and the conductive board 14, insulating layers 26, and secondary conductive member 32 throughout the entire area of the solar battery 10, particularly with the spherical semiconductors 12 in a high density arrangement. Variation in the relationship of these elements may alter the operating characteristics of the semi conductors 12 and the performance of the battery 10.

Further, the manufacture of the solar battery 10 may involve multiple steps and processes. Manufacture may thus be relatively complicated. As a result, the costs attendant such manufacture may also be high.

Further, in forming an electrode, a contact terminal is needed for both the primary conductive skin 16 and the secondary conductive member 32. With the light receiving area being decreased, it may be difficult to construct an effective contact terminal.

SUMMARY OF THE INVENTION

In one form, the invention is directed to a method of forming a solar battery assembly. The method includes the steps of: providing a plurality of spherically-shaped cells, each having a semiconductor layer and an outer electrode layer; forming a solder layer between the plurality of spherically-shaped cells so as to maintain the plurality of spherically-shaped cells in a desired relationship; removing a part of the outer electrode layer to expose a part of the semiconductor layer; and placing an inner electrode in contact with the exposed part of the semiconductor layer.

The method may further include the step of preliminarily maintaining the plurality of spherically-shaped cells in the desired relationship before forming the solder layer.

In one form, each of the plurality of spherically-shaped cells in the desired relationship has a top side and a diametrically opposite bottom side and the step of preliminarily maintaining the plurality of spherically-shaped cells in the desired relationship involves applying an adhesive layer to the top sides of the plurality of spherically-shaped cells.

The method may further include the step of aligning the plurality of spherically-shaped cells in the desired relationship on a tray surface before applying the adhesive layer.

The method may further include the steps of inverting the adhesive layer with the plurality of spherically-shaped cells adhered thereto into a soldering orientation in which the bottom sides of the plurality of spherically-shaped cells are exposed and above the top sides of the plurality of spherically-shaped cells.

The step of forming a solder layer may involve sprinkling solder particles over the plurality of spherically-shaped cells and into a space between the adhesive layer and the plurality of spherically-shaped cells with the adhesive layer and the plurality of spherically-shaped cells adhered thereto in the soldering orientation.

The step of forming a solder layer may further involve the steps of liquefying the solder particles in the space between the adhesive layer and the plurality of spherically-shaped cells and thereafter solidifying the liquefied solder particles so that the solder layer connects between the plurality of spherically-shaped cells.

The method may further include the steps of removing at least a part of the adhesive layer and etching the solder layer from the bottom sides of the plurality of spherically-shaped cells.

The step of removing a part of the outer electrode layer may involve using the solder layer as a mask while removing the part of the outer electrode layer.

The semiconductor layer may include a P-type layer and an N-type layer. The method may further include the step of removing a part of one of the N-type and P-type layers to expose a part of the other of the N-type and P-type layers. The step of placing the inner electrode in contact with the exposed part of the semiconductor layer may involve placing the inner electrode in contact with the part of the other of the N-type and P-type layers.

The outer electrode layer may be a transparent conducting film over the semiconductor layer.

The step of placing the inner electrode in contact with the exposed part of the semiconductor layer may involve fixing a conductive sheet defining the electrode to the plurality of spherically-shaped cells to thereby maintain the plurality of spherically-shaped cells fixedly in the desired relationship.

The method may further include the step of forming an insulative layer on the conductive sheet between the plurality of spherically-shaped cells to thereby insulate the inner electrode from the outer electrode layer.

The method may further include the step of impregnating the exposed part of the semiconductor layer with impurities before placing the inner electrode in contact with the exposed part of the semiconductor layer.

The method may further include the step of applying an insulative material to the solder layer after etching the solder layer and before removing the part of the outer electrode layer to expose a part of the semiconductor layer.

The step of applying an insulative layer may involve applying an insulative layer that is a low viscosity insulating resin.

The insulative layer may be applied as a film, as by spin coating.

In one form the plurality of spherically-shaped cells are in contact with each other with the spherically-shaped cells in the desired relationship.

Each of the plurality of spherically-shaped cells may have a spherical core over which the semiconductor layer is applied.

The spherical core may be made from an insulative material. Alternatively, the spherical core may be made from metal, which may be in electrical contact with the inner electrode.

One of the N-type and P-type layers may be defined by a spherical core.

In one form, the solder layer electrically connects between the outer electrodes of the plurality of spherically-shaped cells.

The invention is also directed to a solar battery having a plurality of cells, a conductive layer fixed to the plurality of cells, and a solder layer. The cells each have a semiconductor layer and an outer electrode layer. The semiconductor layer has a P-type layer and an N-type layer, with there being a part of one of the N-type and P-type layers exposed through the outer electrode layer. The conductive layer is fixed to the plurality of cells in contact with the exposed part of the one of the N-type and P-type layers. The solder layer extends between the conductive layer and the plurality of cells so as to electrically connect between the outer electrodes of the plurality of cells. The solder layer is electrically insulated from the conductive layer.

The plurality of cells may be spherically-shaped cells.

In one form, the outer electrode layer is a transparent conducting film.

The solar battery may further include an insulative layer on the solder layer between the solder layer and the conductive layer.

In one form, one of the P-type and N-type layers is a silicon sphere and the other of the P-type and N-type layers is a silicon layer on the silicon sphere.

Each of the plurality of cells may have a metal core. The metal core may be spherically shaped. In one form, the metal core is exposed through the semiconductor layer and in electrical contact with the conductive layer.

The semiconductor layer may be formed around the metal core.

The solar battery assembly may further include an insulative layer over the conductive layer which electrically insulates the outer electrode layers from the conductive layer.

BRIEF DESCRIPTION OF THE DRAWINGS

FIG. 3 is a cross-sectional view of the solar battery assembly, taken along line 3—3 of FIG. 2;

FIGS. 4–10 are views as in FIG. 3 and showing the sequential formation of components to produce the solar battery assembly in FIGS. 2 and 3;

FIG. 11 is a view as in FIG. 3 of a modified form of solar battery assembly, according to the present invention;

FIG. 12 is a view as in FIG. 8 and showing an additional component which may be added before the steps in FIGS. 9 and 10 are carried out;

DETAILED DESCRIPTION OF THE DRAWINGS

Figure 1:
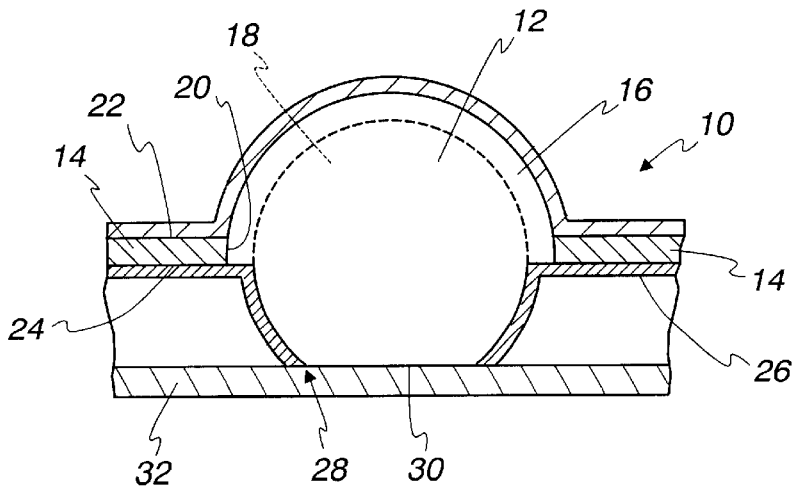
FIG. 1 is a fragmentary, cross-sectional view of a conventional solar battery assembly made using spherical semiconductors.
Figure 2:
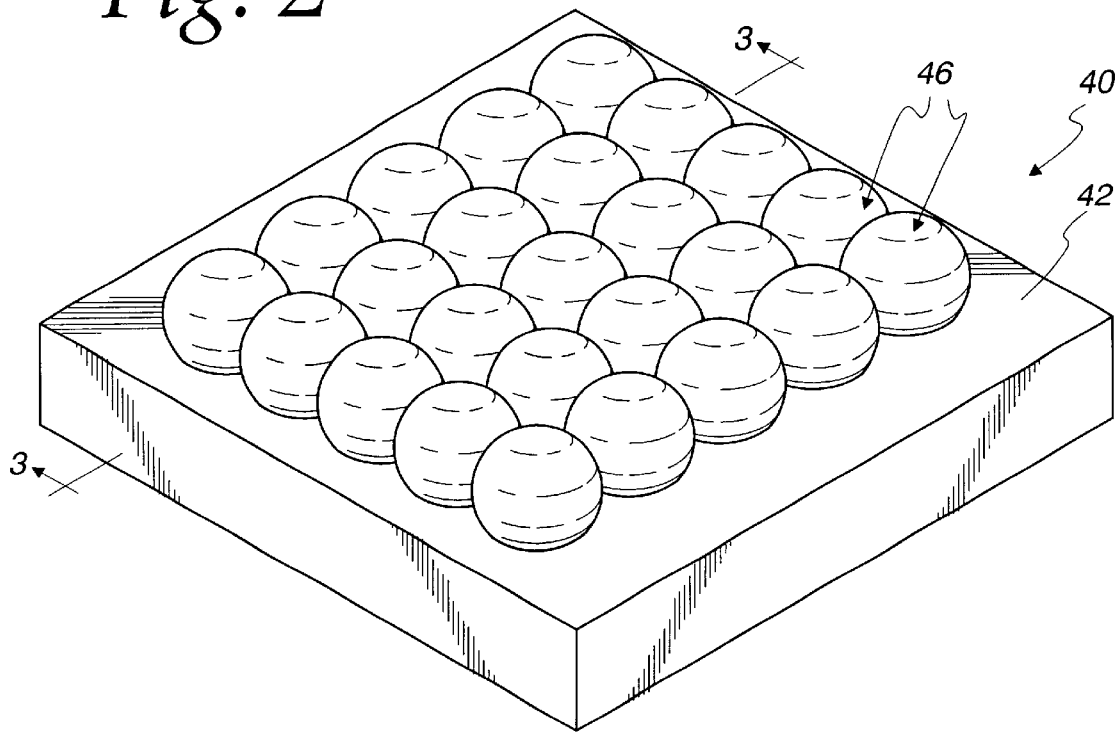
FIG. 2 is a perspective view of a solar battery assembly made according to the present invention.

One form of solar battery assembly, according to the present invention, is shown at 40 in FIGS. 2 and 3. The solar battery assembly 40 consists of a conductive sheet/layer 42 having a surface 44 to which a plurality of spherically-shaped cells 46 are applied in a preselected manner. A polyamide insulative film 47 is applied to the surface of the conductive sheet/layer 42 facing oppositely to the surface 44.

Each cell 46 consists of a semiconductor layer 48 over which an outer electrode layer 50 is applied. The semiconductor layer 48 consists of an N-type polycrystal silicon layer 52 applied over a P-type polycrystal silicon sphere/layer 54. The P-type layer 54 typically has a diameter on the order of 1 mm. Accordingly, a P–N connection is made at the interface between the N-type and P-type layers 52, 54. The outer electrode layer 50 is made of light transmissive indium tin oxide (ITO).

A portion of the outer electrode layer 50 and N-type layer 52 is removed in the region at 56 so as to thereby expose the P-type layer 54. The conductive sheet/layer 42 is adhered to the cells 46 in the region 56 so that the conductive sheet/layer 42 is in contact with the P-type layer 54.

A solder layer 58 fills a space between the outer electrode layers 50 of adjacent cells 46 so as to electrically connect between the outer electrode layers 50.

An insulative, underfill layer 60 is formed between the solder layer 58 and outer electrode layers 50 and the conductive sheet/layer 42 to electrically isolate the solder layer 58 from the conductive sheet/layer 42 and prevent shorting between the electrode layers 50 and the conductive sheet/layer 42.

One method of manufacturing the solar battery assembly 40, according to the present invention, will now be described with respect to FIGS. 4–10. As shown in FIGS. 4 and 5, the cells 46 are initially constructed. P-type polycrystal silicon particles or P-type amorphous silicon particles are dropped while being heated in a vacuum so that polycrystal silicon spherical elements/layers 54 of suitable crystallinity are formed. The N-type polycrystal silicon layer 52 is formed against the P-type layer 54, as by a CVD method using a mixture of gas, such as silane, containing phosphine. Using the CVD process, a thin film can be formed by supplying and exhausting gas, heated to a desired reaction temperature, as the individual spheres/layers 54 are conveyed through a conduit, such as a narrow tube. Through this same process, the N-type layer 52 can be formed at the same time as the P-type spheres/layers 54 as they are elevated and dropped through an appropriate gas environment.

At the completion of these steps, the outer electrode layer 50 is formed as an ITO thin film of approximately 1 μm thickness around the exposed surface 62 of the N-type layer 52. The electrode layer 50 may be formed by a sputtering process.

As shown in FIG. 6, the cells 46, thus formed, are then disposed on a surface 64 of a tray 66 in rows and in a pre-selected abutting relationship. The surface 64 of the tray 66 may have a square or rectangular shape corresponding to the desired final shape of the solar battery assembly 40. The tray 66 can be dimensioned so that the cells 46, within the confines thereof, consistently assume a desired dense, abutting relationship without the requirement for manual alignment thereof. An adhesive tape 68, having an adhesive layer 70 thereon, is pressed downwardly in the direction of the arrow 72 against the exposed top sides 74 of the cells 46 arranged in the desired row relationship on the tray surface 64. This preliminarily fixes the desired relationship of the cells 46.

Figure 7:
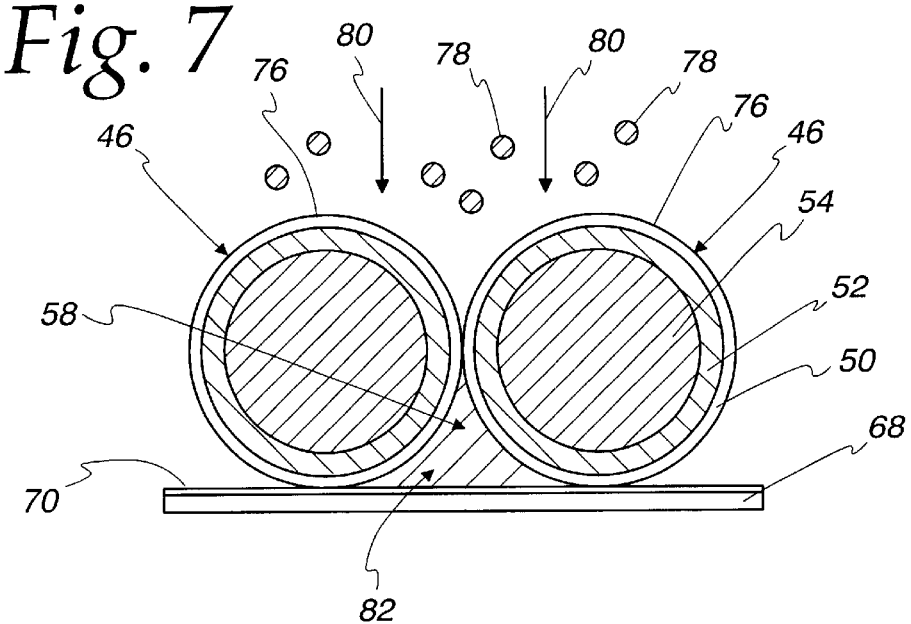

The adhesive tape 68, with the cells 46 adhered thereto, is lifted to remove the cells 46 from the tray 66 and then inverted to a soldering orientation, as shown in FIG. 7 so that the bottom sides 76 of the cells 46 are exposed. With the adhesive tape 68 and cells 46 in the FIG. 7, soldering orientation, solder particles 78 are directed downwardly in the direction of the arrows 80 over the cells 46 and migrate to a space 82 defined between adjacent cells 46 and the adhesive tape 68. The solder particles 78 are then liquefied and solidified within the space 82 so that a solder layer 58 is formed to electrically connect between the outer electrode layers 50 of adjacent cells 46. The solidified layer 58 also fixedly maintains the desired relationship between the cells 46.

Figure 8:
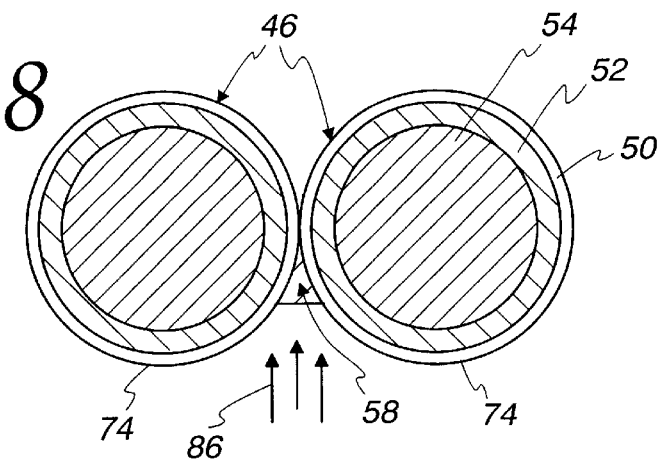

As shown in FIG. 8, the adhesive tape 68 is then removed and the solder layer 58 is etched, as indicated by the arrows 86, from the top sides 74 of the cells 46, to a desired thickness.

Figure 9:
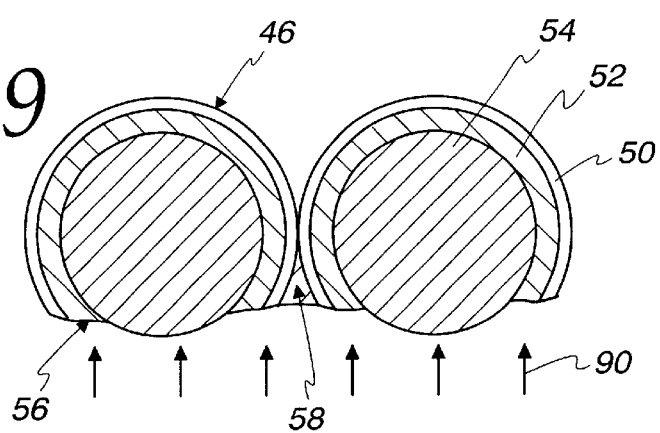

As shown in FIG. 9, with the solder layer 58 performing the function of a mask, the outer electrode layer 50 and N-type layer 52 are removed in the region at 56 to expose the P-type silicon spheres/layers 54.

As shown in FIG. 10, the surface 44 of the conductive sheet/layer 42 is adhered, as by thermal compression bonding, to the P-type silicon spheres/layers 54. The insulative underfill layer 60 is formed between the solder layer 58 and the surface 44 of the conductive sheet/layer 42. The insulative underfill layer 60 occupies the space between the exposed edges 88 of the outer electrode layers 50 and the surface 44 of the conductive sheet/layer 42 so as to prevent shorting between the outer electrode layers 50 and the conductive sheet/layer 42. The insulative underfill layer 60 may be formed by pouring a resin material.

The solder in the layer 58 performs the functions of fixing the cells 46 and also obviates the need for a mask, as is conventionally used during the etching process.

Performance of a photolithography process on spherical silicon may be difficult to perform. The invention, as described above, obviates the need to perform the photolithography process.

Also, using a flexible conductive sheet/layer 42, the cells 46 can be fixed together and interconnected to produce a highly reliable ohmic connection.

A specially configured conductive sheet/layer 42 is not required to make the solar battery assembly 40 with the desired relationship of cells 46 in the high density, abutting relationship shown. By forming the insulative underfill layer 60 after mounting of the cells 46, a predictable and high quality solar battery assembly 40 can be produced. The underfill layer 60 predictably and reliably insulates between the outer electrode layers 50 and the conductive sheet/layer 42.

The invention also contemplates that P-type impurities can be directed against the cells 46, as indicated by the arrows 90 in FIG. 9, to produce a high concentration layer, prior to the application of the conductive sheet/layer 42. With this high concentration layer, the ohmic connectivity of the conductive sheet/layer 42 and the P-type sphere/layer 54 can be made highly effective. Additionally, the high concentration layer becomes a barrier to electrons activated by photons, as a result of which a back surface field effect can be obtained resulting in a potentially improved efficiency.

The tray 66 can be dimensioned so that the cells 46 therein can be spread out predictably in a compact arrangement in contact with each other. The desired relationship between the cells 46 can be consistently maintained. This facilitates construction of high cell density solar battery assemblies.

In FIG. 11, a variation of the inventive process is shown. In FIG. 11 the insulative underfill layer 60 is formed as an insulating film pattern consisting of polyamide film formed vertically and horizontally so as to conform to the cells 46 nested thereagainst. The layer 60 is formed by screen printing on the surface of the conductive sheet/layer 42. The conductive sheet/layer 42 is then fixed by thermal compression bonding in contact with the P-type silicon spheres/layers 54. The conductive sheet/layer 42, on which the layer 60 in FIG. 11 is applied, may be made from flexible copper foil, or the like. The insulative layer 60 in this embodiment effectively insulates between the united solder layer 58 and outer electrode layers 50 and the conductive sheet/layer 42.

Another variation of the present invention is shown in FIG. 12. After etching of the solder layer 58 takes place, as shown in FIG. 8, the joined cells 46 are inverted from the FIG. 8 orientation to that shown in FIG. 12. An insulative layer 96 is then applied over the outer surface 98 of the solder layer 58 and against the outer electrode layer 50. The insulative layer 96 may be made from a polyamide resin of low viscosity, which may be applied by spin coating so as to fully cover the outer surface 98 of the solder layer 58. The remaining steps, previously described, may then be performed, with reference to FIGS. 9 and 10.

Figure 13:
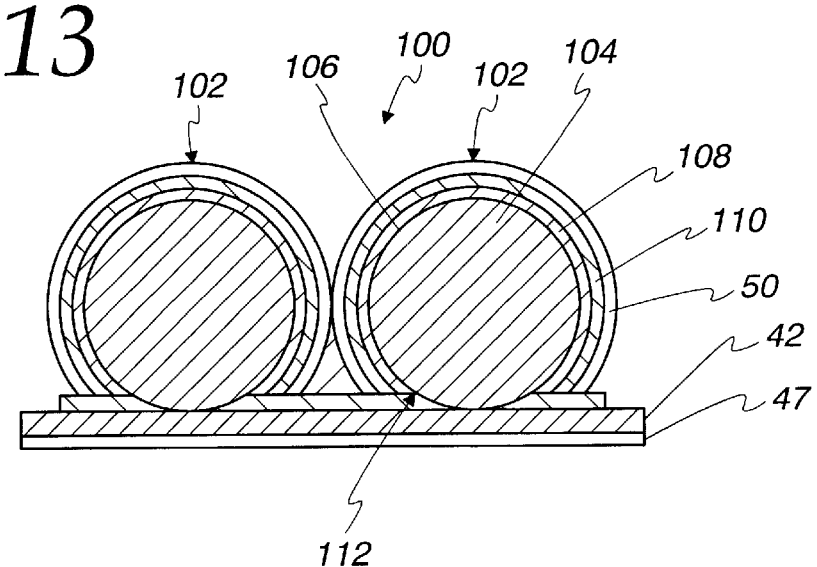
FIG. 13 is a view as in FIG. 11 of a further modified form of solar battery assembly, according to the present invention.

Another variation of the present invention is shown in FIG. 13. In FIG. 13, the solar battery assembly is shown at 100 with cells 102, corresponding to the cells 46 formed on the conductive sheet/layer 42 in a pre-selected relationship. In this embodiment, a spherical metal core 104, made from copper, or the like, is utilized. On the exposed surface 106 of the metal core 104, a P-type polycrystal silicon layer 108 and N-type polycrystal silicon layer 110, corresponding to the layers 54, 52, previously described, are consecutively formed on the surface 106 to make a P–N connection. The P-type and N-type layers 108, 110 may alternatively be amorphous silicon layers in this and other embodiments described herein. The outer electrode layer 50 is then applied over the semiconductor layer made up of the P-type and N-type layers 108, 110.

For the conductive sheet/layer 42 to be electrically connected to the metal core 104, portions of the outer electrode layer 50, the P-type layer 108, and N-type layer 110 are removed in the region 112.

With this arrangement, low contact resistance with the conductive sheet/layer 42 can be realized. This construction may also be used to make good series and parallel connection. With a series connection, the cells 102 which reverse the P-layer and N-layer at the outer and inner sides are alternately arranged. By connection in the same manner, a series connector can be formed.

Figure 14:
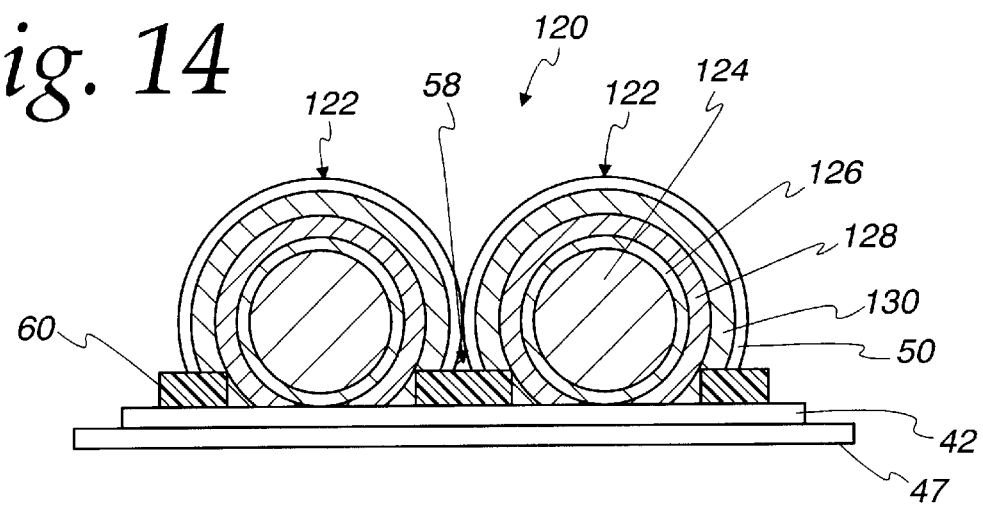
FIG. 14 is a view as in FIG. 13 of a still further modified form of solar battery assembly, according to the present invention.
Figure 15:
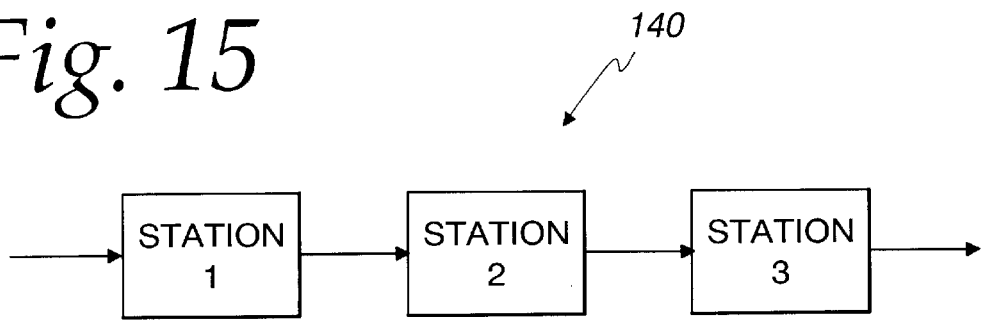
FIG. 15 is a schematic representation of a system for forming solar battery assemblies, such as those shown in FIGS. 2–14, according to the present invention.

A further variation, according to the present invention, is shown at FIG. 14. In FIG. 14, a solar battery assembly is shown at 120 with spherical cells 122 attached to the conductive sheet/layer 42. The cells 122 have an insulative spherical core 124 which is surrounded by a conductive layer 126. The core 124 may be a 1 mm diameter glass element, with the conductive layer 126 being made from chrome. The layer 126 is covered by a semiconductor layer consisting of an N-type amorphous silicon layer 128 and a P-type amorphous silicon layer 130. The outer electrode layer 50 has the composition and construction, previously described. A part of the outer electrode layer 50, the N-type layer 128, and P-type layer 130 can be removed to expose the conductive layer 126. This permits the exposed conductive layer 126 to be bonded directly to the conductive sheet/layer 42 so as to make electrical contact therewith.

The solar battery 120 can be otherwise constructed, in the manner previously described, to form a solder layer 58 and insulative underfill layer 60.

The inventive process lends itself to the construction of highly efficient solar batteries, i.e. with good electromotive force per unit area. Also miniaturization of the solar battery assemblies is facilitated.

The various components of the solar battery assemblies 40, 100, 120 can be formed in a continuous and efficient manner serially through a system shown schematically at 140 in FIG. 14. The components can be moved one by one through the various stations to progressively form the solar battery assemblies 40, 100, 120. Different atmospheres, isolated from the ambient environment, may be maintained at each station. Isolation is desirable since silicon surfaces easily oxidize. With a natural oxidation layer formed on the cells, connectivity to the outer electrode may not be as effective as desired. The environments may contain not only gases, such as active and insert gases, but also liquid such as water and other solutions. The atmosphere from one station may be exhausted before the components of the solar battery assemblies 40, 100, 120 are conveyed to the next station. High quality solar battery assemblies may be consistently produced at a relatively high rate. High efficiency may translate into relatively low manufacturing costs.

In the embodiments described above, in addition to using polycrystal silicon and amorphous silicon, the use of monocrystal silicon applied to semiconductor layer compounds such as GaAs and GaP is also contemplated. Application to P-I-N structures is also contemplated.

The foregoing disclosure of specific embodiments is intended to be illustrative of the broad concepts comprehended by the invention.

What is claimed is:

1. A method of forming a solar battery assembly, said method comprising the steps of:
    providing a plurality of spherically-shaped cells each comprising a semiconductor layer and an outer electrode layer;
    forming a solder layer between the plurality of spherically-shaped cells so as to maintain the plurality of spherically-shaped cells in a relationship;
    removing a part of the outer electrode layer to expose a part of the semiconductor layer; and
    placing an inner electrode in contact with the exposed part of the semiconductor layer.

2. The method of forming a solar battery assembly according to claim 1 further comprising the step of preliminarily maintaining the plurality of spherically-shaped cells in the relationship before forming the solder layer.

3. The method of forming a solar battery assembly according to claim 2 wherein each of the plurality of spherically-shaped cells in the relationship has a top side and a diametrically opposite bottom side, and the step of preliminarily maintaining the plurality of spherically-shaped cells in the relationship comprises the step of applying an adhesive layer to the top sides of the plurality of spherically-shaped cells.

4. The method of forming a solar battery assembly according to claim 3 further comprising the step of aligning the plurality of spherically-shaped cells in the relationship on a tray surface before applying the adhesive layer.

5. The method of forming a solar battery assembly according to claim 4 further comprising the steps of inverting the adhesive layer with the plurality of spherically-shaped cells adhered thereto into a soldering orientation in which the bottom sides of the plurality of spherically-shaped cells are exposed and above the top sides of the plurality of spherically-shaped cells.

6. The method of forming a solar battery assembly according to claim 5 wherein the step of forming a solder layer comprises sprinkling solder particles over the plurality of spherically-shaped cells and into a space between the adhesive layer and the plurality of spherically-shaped cells with the adhesive layer and the plurality of spherically-shaped cells adhered thereto in the soldering orientation.

7. The method of forming a solar battery assembly according to claim 6 wherein the step of forming a solder layer further comprises the steps of liquefying the solder particles in the space between the adhesive layer and the plurality of spherically-shaped cells and thereafter solidifying the liquefied solder particles so that the solder layer connects between the plurality of spherically-shaped cells.

8. The method of forming a solar battery assembly according to claim 7 further comprising the steps of removing at least a part of the adhesive layer and etching the solder layer from the bottom sides of the plurality of spherically-shaped cells.

9. The method of forming a solar battery assembly according to claim 8 wherein the step of removing a part of the outer electrode layer comprises using the solder layer as a mask while removing the part of the outer electrode layer.

10. The method of forming a solar battery assembly according to claim 9 wherein the semiconductor layer comprises a P-type layer and an N-type layer and further comprising the step of removing a part of one of the N-type and P-type layers to expose a part of the other of the N-type and P-type layers and the step of placing the inner electrode in contact with the exposed part of the semiconductor layer comprises placing the inner electrode in contact with the part of the other of the N-type and P-type layers.

11. The method of forming a solar battery assembly according to claim 10 wherein the outer electrode layer comprises a transparent conducting film over the semiconductor layer.

12. The method of forming a solar battery assembly according to claim 1 wherein the step of placing the inner electrode in contact with the exposed part of the semiconductor layer comprises fixing a conductive sheet defining the inner electrode to the plurality of spherically-shaped cells to thereby maintain the plurality of spherically-shaped cells fixedly in the relationship.

13. The method of forming a solar battery assembly according to claim 12 further comprising the step of forming an insulative layer on the conductive sheet between the plurality of spherically-shaped cells to thereby insulate the inner electrode from the outer electrode layer.

14. The method of forming a solar battery assembly according to claim 1 further comprising the step of impregnating the exposed part of the semiconductor layer with impurities before placing the inner electrode in contact with the exposed part of the semiconductor layer.

15. The method of forming a solar battery assembly according to claim 10 further comprising the step of applying an insulative material to the solder layer after etching the solder layer and before removing the part of the outer electrode layer to expose a part of the semiconductor layer.

16. The method of forming a solar battery assembly according to claim 13 wherein the step of forming an insulative layer comprises applying an insulative layer comprising a low viscosity insulative resin.

17. The method of forming a solar battery assembly according to claim 16 wherein the insulative layer is applied as a film.

18. The method of forming a solar battery assembly according to claim 17 wherein the insulative layer is applied by spin coating.

19. The method of forming a solar battery assembly according to claim 10 wherein the plurality of spherically-shaped cells are in contact with each other with the spherically-shaped cells in the relationship.

20. The method of forming a solar battery assembly according to claim 1 wherein each of the plurality of spherically-shaped cells comprises a spherical core over which the semiconductor layer is applied.

21. The method of forming a solar battery assembly according to claim 10 wherein one of the N-type and P-type layers comprises a spherical core.

22. The method of forming a solar battery assembly according to claim 7 wherein the solder layer electrically connects between the outer electrodes of the plurality of spherically-shaped cells.

23. A method of forming a solar battery assembly, said method comprising the steps of:
   providing a plurality of spherically-shaped cells each comprising a semiconductor layer and an outer electrode layer;
   forming a solder layer between the plurality of spherically-shaped cells so as to maintain the plurality of spherically-shaped cells in a relationship;
   removing a part of the outer electrode layer to expose a part of the semiconductor layer; and
   placing an inner electrode in contact with the exposed part of the semiconductor layer,
   wherein each of the plurality of spherically-shaped cells comprises a spherical core over which the semiconductor layer is applied,
   wherein the spherical cores comprise an insulative material.

24. A method of forming a solar battery assembly, said method comprising the steps of:
   providing a plurality of spherically-shaped cells each comprising a semiconductor layer and an outer electrode layer;
   forming a solder layer between the plurality of spherically-shaped cells so as to maintain the plurality of spherically-shaped cells in a relationship;
   removing a part of the outer electrode layer to expose a part of the semiconductor layer; and
   placing an inner electrode in contact with the exposed part of the semiconductor layer,
   wherein each of the plurality of spherically-shaped cells comprises a spherical core over which the semiconductor layer is applied,
   wherein the spherical cores comprise metal in electrical contact with the inner electrode.

25. A solar battery assembly comprising:
   a plurality of cells each comprising a semiconductor layer and an outer electrode layer;
   the semiconductor layer comprising a P-type layer and an N-type layer,
   there being a part of one of the N-type and P-type layers exposed through the outer electrode layer;
   a conductive layer fixed to the plurality of cells in contact with the exposed part of the one of the N-type and P-type layers; and
   a solder layer between the conductive layer and the plurality of cells so as to electrically connect between the outer electrodes of the plurality of cells,
   the solder layer electrically insulated from the conductive layer.

26. The solar battery assembly according to claim 25 wherein the plurality of cells are spherically-shaped cells.

27. The solar battery assembly according to claim 26 further comprising an insulative layer on the solder layer between the solder layer and the conductive layer.

28. The solar battery assembly according to claim 25 wherein one of the P-type and N-type layers comprises a silicon sphere and the other of the P-type and N-type layer comprises a silicon layer on the silicon sphere.

29. The solar battery assembly according to claim 25 further comprising an insulative layer over the conductive layer which electrically insulates the outer electrode layers from the conductive layer.

30. A solar battery assembly comprising:
   a plurality of cells each comprising a semiconductor layer and an outer electrode layer,
   the semiconductor layer comprising a P-type layer and an N-type layer,
   there being a part of one of the N-type and P-type layers exposed through the outer electrode layer;
   a conductive layer fixed to the plurality of cells in contact with the exposed part of the one of the N-type and P-type layers; and
   a solder layer between the conductive layer and the plurality of cells so as to electrically connect between the outer electrodes of the plurality of cells,
   the solder layer electrically insulated from the conductive layer,
   wherein the plurality of cells are spherically-shaped cells,
   wherein the outer electrode layer comprises a light transmitting conducting film.

31. A solar battery assembly comprising:
   a plurality of cells each comprising a semiconductor layer and an outer electrode layer,
   the semiconductor layer comprising a P-type layer and an N-type layer,
   there being a part of one of the N-type and P-type layers exposed through the outer electrode layer;
   a conductive layer fixed to the plurality of cells in contact with the exposed part of the one of the N-type and P-type layers; and
   a solder layer between the conductive layer and the plurality of cells so as to electrically connect between the outer electrodes of the plurality of cells, the solder layer electrically insulated from the conductive layer, wherein each of the plurality of cells comprises a metal core.

32. The solar battery assembly according to claim 31 wherein each metal core has a spherical shape.

33. The solar battery assembly according to claim 31 wherein the metal core is exposed through the semiconductor layer and in electrical contact with the conductive layer.

34. The solar battery assembly according to claim 33 wherein the semiconductor layer is formed around the metal core.

35. A method of forming a solar battery assembly, said method comprising the steps of:

providing a plurality of spherically-shaped cells each comprising a semiconductor layer and a separate outer electrode layer applied to the semiconductor layer;

forming a solder layer between the plurality of spherically-shaped cells so as to maintain the plurality of spherically-shaped cells in a relationship;

removing a part of the outer electrode layer to expose a part of the semiconductor layer; and placing an inner electrode in contact with the exposed part of the semiconductor layer.

36. A solar battery assembly comprising:

a plurality of cells each comprising a semiconductor layer and a separate outer electrode layer applied to the semiconductor layer, the semiconductor layer comprising a P-type layer and an N-type layer, there being a part of one of the N-type and P-type layers exposed through the outer electrode layer;

a conductive layer fixed to the plurality of cells in contact with the exposed part of the one of the N-type and P-type layers; and a solder layer between the conductive layer and the plurality of cells so as to electrically connect between the outer electrodes of the plurality of cells, the solder layer electrically insulated from the conductive layer.

* * * * *

UNITED STATES PATENT AND TRADEMARK OFFICE
CERTIFICATE OF CORRECTION

PATENT NO.    : 6,417,442 B1
DATED         : July 9, 2002
INVENTOR(S)   : Fukui et al.

It is certified that error appears in the above-identified patent and that said Letters Patent is hereby corrected as shown below:

<u>Title page,</u>
Insert item: -- [30] Foreign Application Priority Data
Dec. 16, 1999 [JP]…………………………….. 11-358179 --

Signed and Sealed this

Twenty-second Day of July, 2003

JAMES E. ROGAN
*Director of the United States Patent and Trademark Office*